(12) United States Patent
Hopper et al.

(10) Patent No.: US 8,519,506 B2
(45) Date of Patent: Aug. 27, 2013

(54) THERMALLY CONDUCTIVE SUBSTRATE FOR GALVANIC ISOLATION

(75) Inventors: Peter J. Hopper, San Jose, CA (US); William French, San Jose, CA (US); Ann Gabrys, Santa Clara, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 153 days.

(21) Appl. No.: 13/170,451

(22) Filed: Jun. 28, 2011

(65) Prior Publication Data

US 2013/0001735 A1  Jan. 3, 2013

(51) Int. Cl.
*H01L 29/02* (2006.01)

(52) U.S. Cl.
USPC ............. 257/499; 257/93; 257/446; 257/501; 257/717; 257/720

(58) Field of Classification Search
USPC ............................. 257/93, 446, 501, 717, 720
See application file for complete search history.

(56) References Cited

U.S. PATENT DOCUMENTS

| 6,462,976 | B1 * | 10/2002 | Olejniczak et al. | 363/147 |
| 6,705,388 | B1 * | 3/2004 | Sorgo | 165/80.3 |
| 7,052,937 | B2 * | 5/2006 | Clevenger et al. | 438/122 |
| 7,709,292 | B2 * | 5/2010 | Sadwick et al. | 438/107 |
| 2007/0298537 | A1 * | 12/2007 | Sung | 438/105 |
| 2009/0104769 | A1 * | 4/2009 | Lee et al. | 438/653 |
| 2009/0194773 | A1 * | 8/2009 | Hanson et al. | 257/77 |
| 2010/0064818 | A1 * | 3/2010 | Shubert | 73/754 |
| 2012/0002377 | A1 * | 1/2012 | French et al. | 361/748 |
| 2012/0075216 | A1 * | 3/2012 | Black et al. | 345/173 |

* cited by examiner

*Primary Examiner* — Chuong A Luu
*Assistant Examiner* — Jaehwan Oh
(74) *Attorney, Agent, or Firm* — Eugene C. Conser; Wade J. Brady, III; Frederick J. Telecky, Jr.

(57) ABSTRACT

A galvanic isolation integrated circuit system includes a semiconductor substrate; a layer of thermally conductive material, e.g., CVD nano- or poly-diamond thin film or boron nitride CVD thin film, formed over the semiconductor substrate; a first integrated circuit structure formed over the layer of thermally conductive material; a second integrated circuit structure formed over the layer of thermally conductive material, the second integrated circuit structure being spaced apart from the first integrated circuit structure; and a galvanic isolation structure formed over the layer of thermally conductive material between the first and second integrated circuit structures and connected to the first integrated circuit structure and the second integrated circuit structure.

6 Claims, 5 Drawing Sheets

THERMALLY CONDUCTIVE SUBSTRATE FOR GALVANIC ISOLATION

RELATED APPLICATION

This application is related to co-pending and commonly-assigned application Ser. No. 12/827,316, filed on Jun. 30, 2010, by French et al. and titled "Galvanic Isolation Transformer."

FIELD OF THE INVENTION

The present invention relates to galvanic isolation of integrated circuits fabricated on a thermally conductive substrate utilizing, for example, diamond thin films.

BACKGROUND OF THE INVENTION

Galvanic isolation (GI) integrated circuit (IC) systems enable signals and power to cross an isolation bridge that allows different IC's to operate at different floating voltages. A transformer isolator may be used as central to this type of device. To relay power over a GI bridge, a transformer is switched with transistors driving its primary turns. Secondly, a rectifier is connected to the secondary transformer turns. This is a well known isolating switched power supply topology.

FIG. 1 shows a multi-die galvanic isolation design 100 that utilizes a transformer 102 that is formed on a single silicon substrate 104 to create galvanic isolation between a first integrated circuit 106 formed on a first silicon die 108 and a second integrated circuit formed on a second silicon die 112. FIG. 1 shows the transformer 102 connected between the first integrated circuit 106 and the second integrated circuit 110 by wire bonds 114 that electrically connect the first silicon die 108 and the second silicon die 112 to the transformer substrate 104. The dielectric 116 (shown schematically in FIG. 1) formed between the windings of the transformer 102 must be thick enough to hold off the voltage difference between the first integrated circuit 106 and the second integrated circuit 110.

Above-cited related application Ser. No. 12/827,316, discloses embodiments of an integrated circuit system that comprises a first integrated circuit die having a first integrated circuit formed thereon, a second integrated circuit die having a second integrated circuit formed thereon, and a transformer that is formed on a dielectric substrate (e.g., quartz or glass) and that is electrically connected between the first integrate circuit and the second integrated circuit to provide galvanic isolation therebetween.

FIG. 2 shows one such embodiment in which an integrated circuit system 200 includes a transformer 202 formed on a dielectric substrate 204 and connected between a first integrated circuit 206 formed on a first semiconductor (e.g., silicon) die 208 and a second integrated circuit 210 formed on a second semiconductor (e.g., silicon) die 212. In the FIG. 2 embodiment, both the first semiconductor die 208 and the second semiconductor die 212 are also formed on the dielectric substrate 204. As disclosed in application Ser. No. 12/827,316, the dielectric substrate 204 may include, but is not limited to, a quartz wafer or any insulating wafer such as a glass wafer or a version thereof (e.g., pyrex, soda-lime, borosilicate glass or aluminaborosilicate glass). The first integrated circuit 206 has a first voltage, e.g., greater than or equal to 5 kV, associated therewith and the second integrated circuit 210 has a second voltage associated therewith that is less than the first voltage. FIG. 2 shows wire bonds 214 that electrically connect the transformer 202 between the first integrated circuit 206 and the second integrated circuit 210.

SUMMARY OF THE INVENTION

An embodiment of a galvanic isolation integrated circuit system includes a semiconductor substrate; a layer of thermally conductive material, e.g. diamond, formed over the semiconductor substrate; a first integrated circuit structure formed over the layer of thermally conductive material; a second integrated circuit structure formed over the layer of thermally conductive material, the second integrated circuit structure being spaced apart from the first integrated circuit structure; and a galvanic isolation structure formed over the layer of thermally conductive material between the first and second integrated circuit structures and connected to the first integrated circuit structure and to the second integrated circuit structure.

The features and advantages of the various aspects of the subject matter disclosed herein will be more fully understood and appreciated upon consideration of the following detailed description and the accompanying drawings, which set forth illustrative embodiments in which the concepts of the claimed subject matter are utilized.

DETAILED DESCRIPTION OF THE INVENTION

The ability to relay power by a galvanic isolation (GI) bridge is governed in large part by the ability to sink heat generated by the active integrated circuits. The requirement for isolation, however, requires that the transformer be built upon an isolating substrate.

Figure 1:
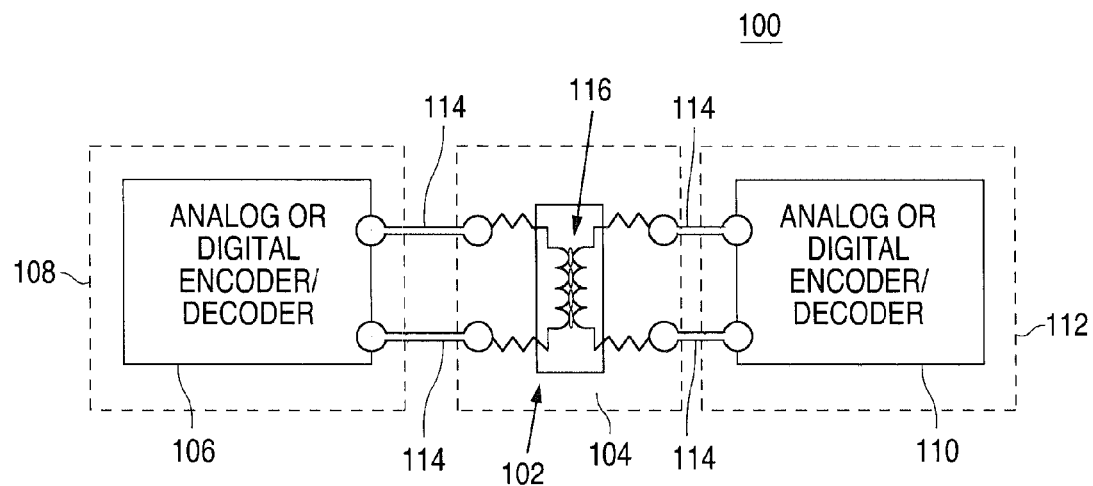
FIG. 1 is a block diagram illustrating utilization of a transformer to provide galvanic isolation between two integrated circuits.
Figure 2:
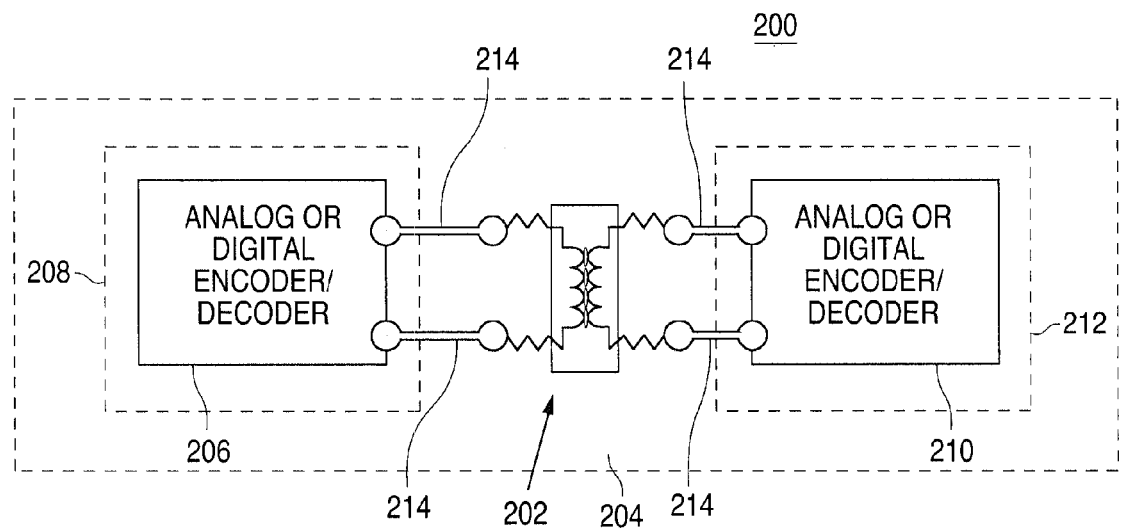
FIG. 2 is a block diagram illustrating utilization of a transformer formed on a dielectric substrate to provide galvanic isolation between two integrated circuits.

FIGS. 1 and 2, which are discussed in greater detail below, show two embodiments of such process architectures. The underlying semiconductor substrate is typically crystalline silicon for reasons of mechanical strength, the ability to be seen by processing robots and the low cost of backside grinding. An optional layer of chemical vapor deposition (CVD) oxide may be formed on the upper surface of the silicon substrate to provide a high value of electrical isolation to the underlying substrate. A layer of thermally conductive material, such as for example a Chemical Vapor Deposition (CVD) nano- or poly diamond film, or a boron nitride CVD film, is deposited on the upper surface of the oxide to act as a thermal heat spreader. Thus, thermal energy is conducted away from the heat generating integrated circuits through the thermally conductive material to a specific heat sink (e.g., lead frame or solder ball) that is tied, for example, to a system printed circuit board (PCB) or a metallic heat sink. This system enables the integrated circuits to run at a higher reliable operating power level because more thermal energy is removed from the location of the integrated circuit than is the case where the integrated circuit is thermally isolated by being mounted on the upper surface of the oxide. More power may thus be relayed across the transformer.

The diamond layer may be patterned (FIG. 5) to improve the small level of leakage that is typical of the electrical conduction characteristics of diamond, or the diamond layer may be used as a blanket film (FIGS. 3, 4, 6) to lower patterning cost. Those skilled in the art will appreciate that the thickness of the diamond layer is application specific to, for example, the thermal performance required and the cost available. As stated above, optionally, the oxide layer may not be present (FIG. 6) for lower voltage isolation conditions in which the leakage to silicon is acceptable.

Figure 3:
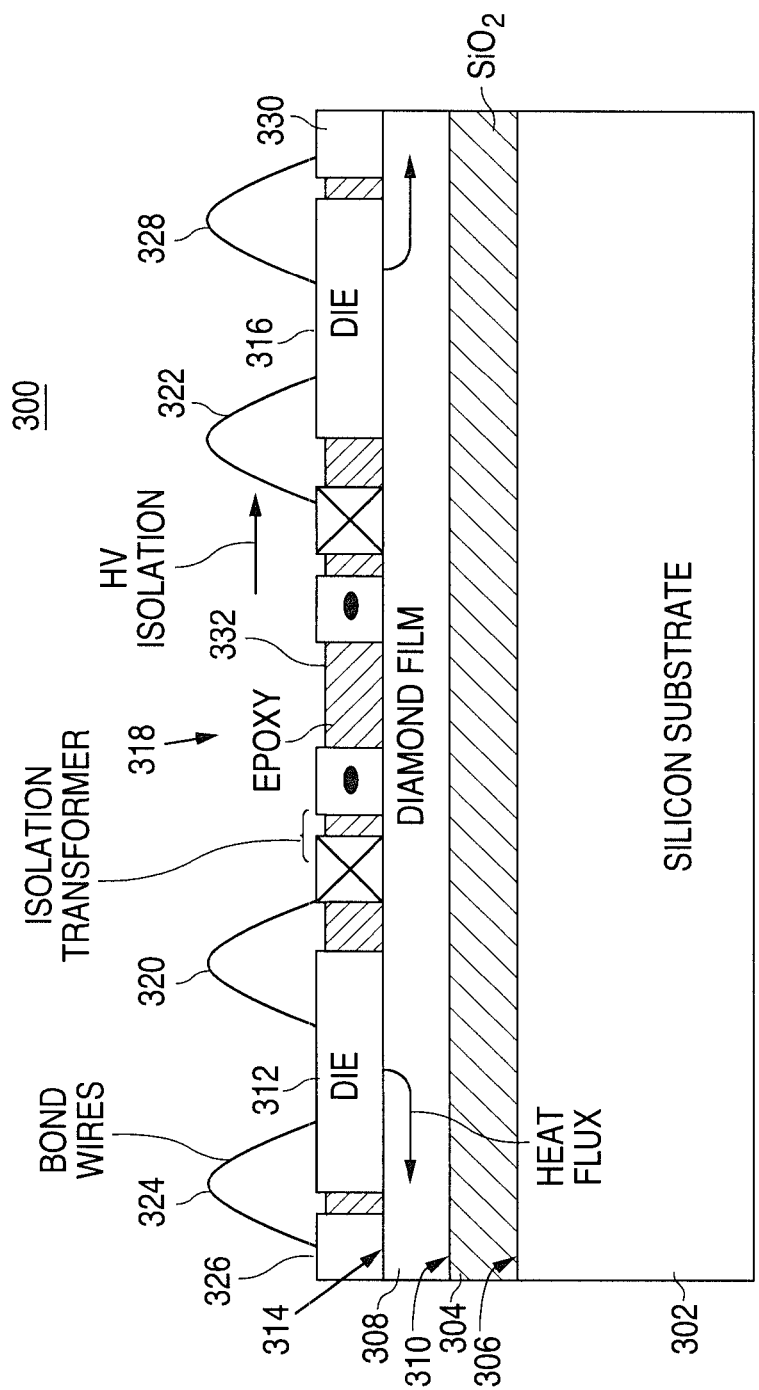
FIG. 3 is a cross-section drawing illustrating an embodiment of galvanically isolated integrated circuits formed on a thermally conductive substrate.
Figure 5:
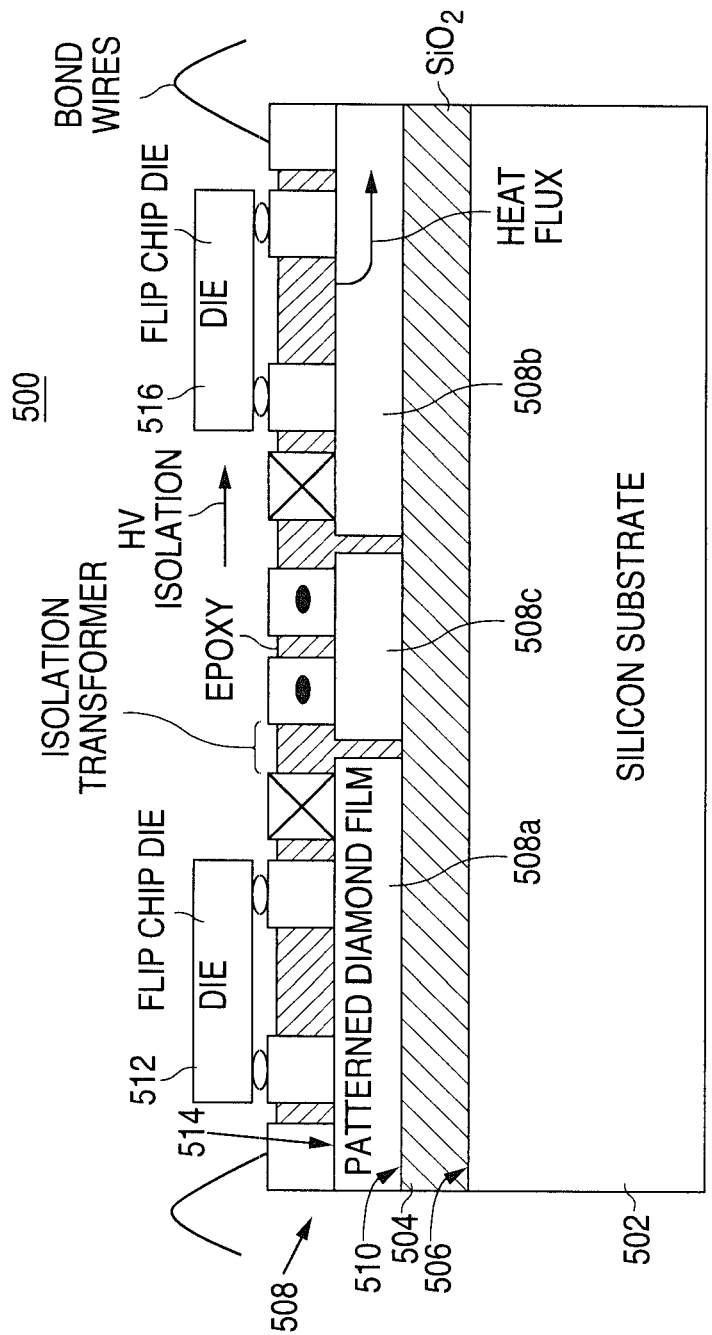
FIG. 5 is a cross-section drawing illustrating another alternate embodiment of galvanically isolated integrated circuits formed on a thermally conductive substrate.

FIG. 3 shows an embodiment of a galvanic isolation integrated circuit system 300. The system 300 includes a semiconductor substrate, for example, a crystalline silicon substrate 302. A layer of dielectric material, for example silicon dioxide ($SiO_2$) 304 is formed on an upper surface 306 of the substrate 302. A layer of thermally conductive material 308 (e.g., CVD nano- or poly-diamond thin film, or a boron nitride CVD thin film) is formed on the upper surface 310 of the layer of silicon dioxide 304. A first integrated circuit structure (Die) 312 having a first operating voltage associated therewith (e.g., 5 kV) is formed directly on the upper surface 314 of the layer of thermally conductive material 308. A second integrated circuit structure (Die) 316 having a second operating voltage associated therewith (e.g., 5V) is formed directly on the upper surface 314 of the layer of thermally conductive material 308 and is spaced apart from the first integrated circuit structure 312. A galvanic isolation structure, for example a transformer (Isolation Transformer) 318, is formed on the layer of thermally conductive material 308 between the first integrated circuit structure 312 and the second integrated circuit structure 316 to provide voltage isolation (HV Isolation) between the first integrated circuit structure 312 and the second integrated circuit structure 316. FIG. 5 shows a wire bond 320 connecting a first winding of the transformer 318 to the first integrated circuit structure 312 and a wire bond 322 connecting a second winding of the transformer 318 to the second integrated circuit structure 316. FIG. 5 also shows a wire bond 324 connecting the first integrated circuit structure 312 to an I/O pad 326 and a wire bond 328 connecting the second integrated circuit structure 316 to an I/O pad 330. Epoxy 332 is formed in the gaps between components formed on the upper surface 314 of the layer of thermally conductive material 308. The arrows in FIG. 3 show the flow of thermal energy (Heat Flux) away from the first and second integrated circuit structures 312, 316 through the layer of thermally conductive material 308.

Figure 4:
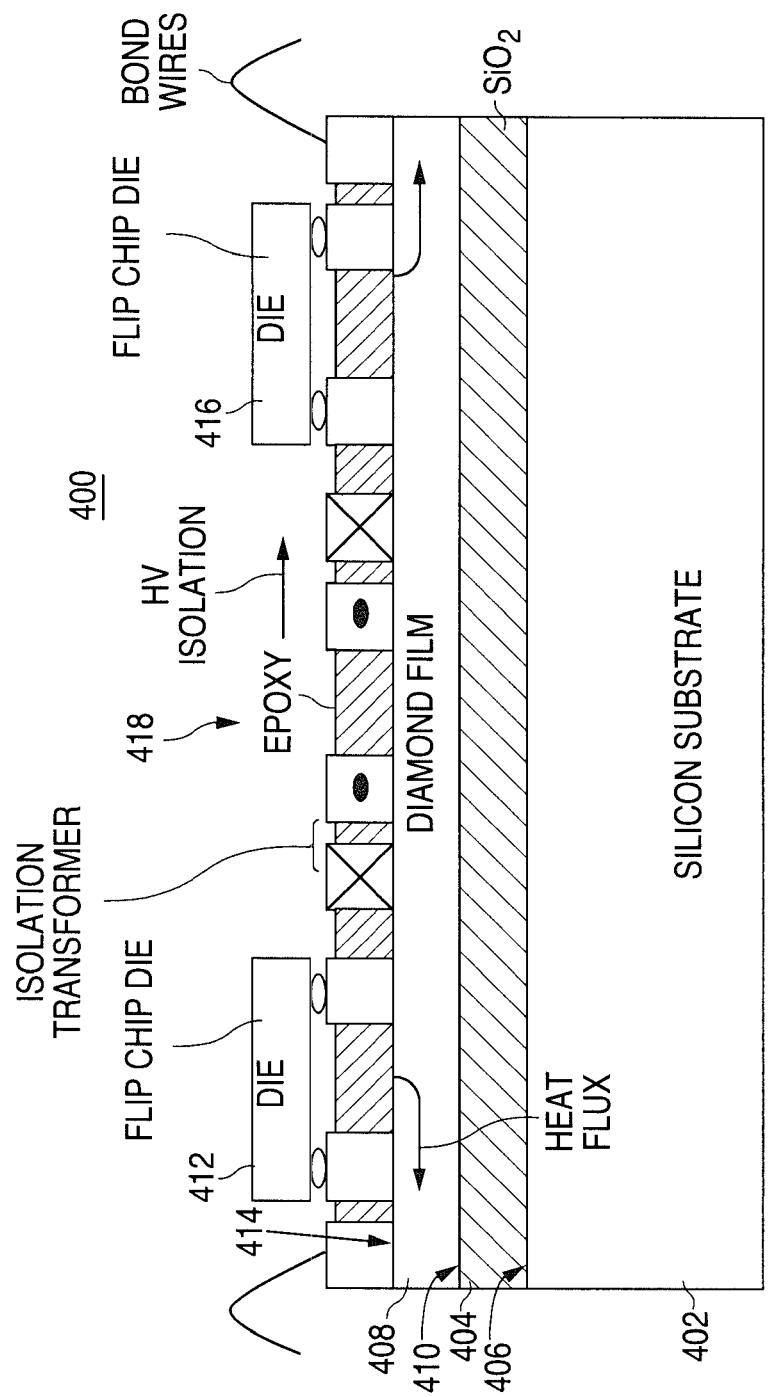
FIG. 4 is a cross-section drawing illustrating an alternate embodiment of galvanically isolated integrated circuits formed on a thermally conductive substrate.

FIG. 4 shows an alternate embodiment of a galvanic isolation integrated circuit system 400. The system 400 includes a semiconductor substrate, for example, a crystalline silicon substrate 402. A layer of dielectric material, for example silicon dioxide ($SiO_2$) 404, is formed on the upper surface 406 of the substrate 402. A layer of thermally conductive material 408 (e.g., CVD nano- or poly-diamond thin film, or boron nitride CVD thin film) is formed on the upper surface 410 of the layer of silicon dioxide 404. A first integrated circuit structure (Flip Chip Die) 412 having a first operating voltage (e.g., 5 kV) associated therewith is formed on the upper surface 414 of the layer of thermally conductive material 408.

A second integrated circuit structure (Flip Chip Die) 416 having a second operating voltage (e.g., 5V) associated therewith is formed on the upper surface 414 of the layer of thermally conductive material 408 and is spaced apart from the first integrated circuit structure 412. A galvanic isolation structure, for example a transformer (Isolation Transformer) 418 is formed on the layer of thermally conductive material 408 between the first integrated circuit structure 412 and the second integrated circuit structure 416 to provide voltage isolation (HV Isolation) between the first flip chip die structure 412 and the second flip chip die structure 416. Once the flip chip die are placed, connections to an outside lead frame are made with either a conventional "wire bonded" (die to lead frame) approach or a well known "flip chip on lead" approach. Epoxy is formed in the gaps between components formed on the upper surface 414 of the layer of thermally conductive material 408. The arrows in FIG. 4 show the flow of thermal energy (Heat Flux) away from the first and second flip chip die structures 412, 416 through the layer of thermally conductive material 408.

FIG. 5 shows another alternate embodiment of a galvanic isolation integrated circuit system 500. The system 500 includes a semiconductor substrate, for example, a crystalline silicon substrate 502. A layer of dielectric material, for example silicon dioxide ($SiO_2$) 504, is formed on an upper surface 506 of the substrate 502. A patterned layer of thermally conductive material 508, for example, a patterned layer of CVD nano- or poly diamond thin film or a boron nitride VCD thin film, is formed on the upper surface 510 of the layer of silicon dioxide 504. A first integrated circuit structure (Flip Chip Die) 512 having a first operating voltage (e.g., 5 kV) associated therewith is formed on the upper surface of a first portion 508a of the patterned layer of thermally conductive material 408. A second integrated circuit structure (Flip Chip Die) 516 having a second operating voltage (e.g., 5V) associated therewith is formed on the upper surface of a second portion 508b of the patterned layer of thermally conductive material 508 and is space-apart from the first integrated circuit structure. A galvanic isolation structure, for example a transformer (Isolation Transformer) 518, is formed on the layer of thermally conductive material 408 between the first integrated circuit structure 512 and the second integrated circuit structure 516 to provide voltage isolation (HV Isolation) between the first flip chip die structure and the second flip chip die structure 516. In the FIG. 5 embodiment, at least a portion of the transformer 518 is formed on the upper surface of a third portion 508c of the layer of thermally conductive material 508. Epoxy is formed in the gaps between components formed on the upper surface of the layer of thermally conductive material 508. The arrows in FIG. 5 show the flow of thermal energy (Heat Flux) away from the first flip chip die structure 512 through the first portion 508a of the patterned layer of thermally conductive material 508 and away from the second flip chip die structure through the second portion 508b of the patterned layer of thermally conductive material 508.

Figure 6:
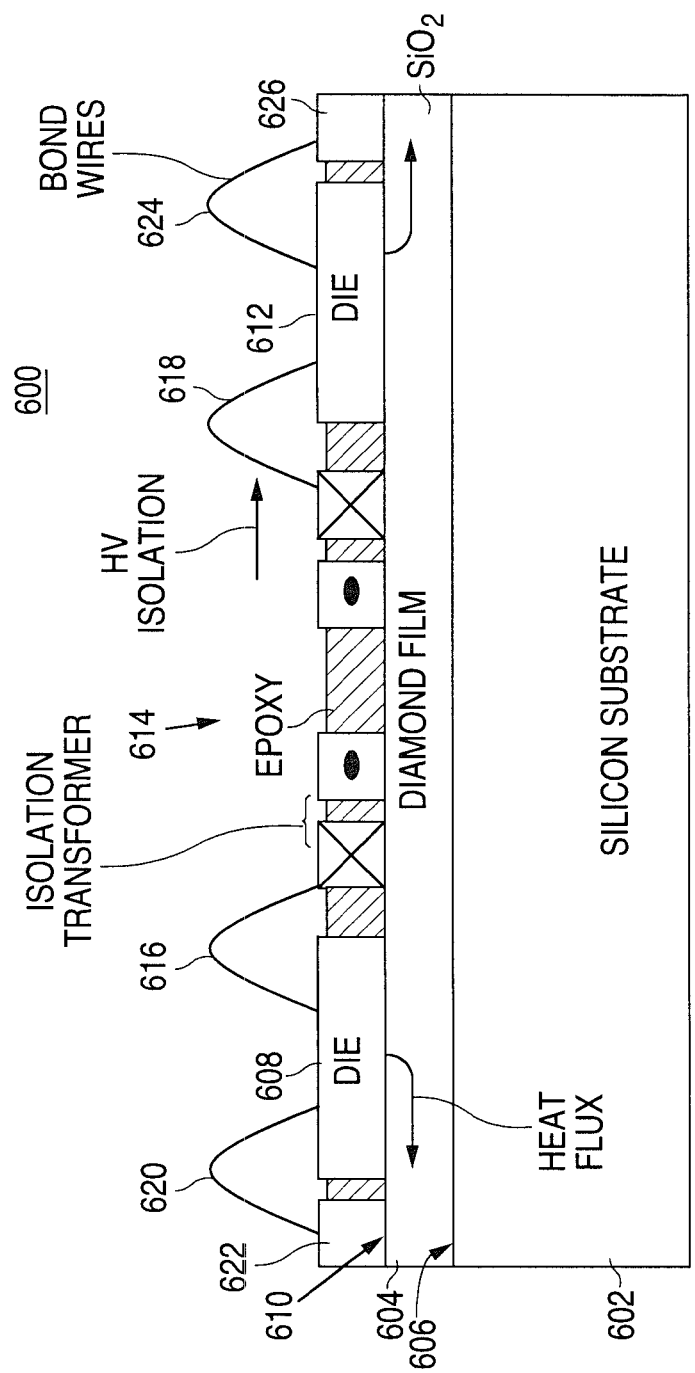
FIG. 6 is a cross-section drawing illustrating yet another alternate embodiment of galvanically isolated integrated circuits formed on a thermally conductive substrate.

FIG. 6 shows yet another alternate embodiment of a galvanic isolation integrated circuit system 600. The system 600 includes a semiconductor substrate, for example, a crystalline silicon substrate 602. A layer of thermally conductive material 604, for example, a CVD nano- or poly-diamond thin film or a boron nitride CVD thin film, is formed on the upper surface 606 of the substrate 602. A first integrated circuit structure (Die) 608 having a first operating voltage (e.g., 5 kV) associated therewith is formed directly on the upper surface 610 of the layer of thermally conductive material 604. A second integrated circuit structure (Die) 612 having a second operating voltage (e.g., 5V) associated therewith is formed directly on the upper surface 610 of the layer of thermally conductive material 604 and is space apart from the first integrated circuit structure 608. A galvanic isolation structure, for example a transformer (Isolation Transformer) 614, is formed on the layer of thermally conductive material 604 between the first integrated circuit structure 608 and the second integrated circuit structure 612 to provide voltage isolation (HV Isolation) between the first integrated circuit structure 608 and the second integrated circuit structure 612. FIG. 6 shows a bond wire 616 connecting a first winding of the transformer 614 to the first integrated circuit structure 608 and a bond wire 618 connecting a second winding of the transformer 614 to the second integrated circuit structure 612. FIG. 6 also shows a wire bond 620 connecting the first integrated circuit structure 608 to an I/O pad 622 and a wire bond 624 connecting the second integrated circuit structure 612 to an I/O pad 626. Epoxy 628 is formed in the gaps between components formed on the upper surface 610 of the layer of thermally conductive material 604. The arrows in FIG. 6 show the flow of thermal energy (Heat Flux) away from the first and second integrated structures 608, 612 through the layer of thermally conductive material 604.

It should be understood that the particular embodiments described herein have been provided by way of example and that other modifications may occur to those skilled in the art without departing from the scope of the claimed subject matter as expressed in the appended claims and their equivalents.

What is claimed is:

1. A galvanic isolation integrated circuit system comprising: a crystalline silicon substrate having an upper surface; a layer of dielectric material formed on the upper surface of the crystalline silicon substrate; a layer of diamond material formed on an upper surface of the layer of dielectric material, wherein the layer of diamond material is patterned to provide first, second and third portions that are spaced apart from one another; a first integrated circuit structure formed on an upper surface of the layer of diamond material; a second integrated circuit structure formed on the upper surface of the layer of diamond material and spaced apart from the first integrated circuit structure; and a transformer formed on the upper surface of the layer of diamond material between the first and second integrated circuit structures and connected to the first integrated circuit structure and the second integrated circuit structure; the first integrated circuit structure being formed on an upper surface of the first portion of diamond material, the second integrated circuit structure being formed on an upper surface of the second portion of diamond material, and at least a portion of the transformer being formed on an upper surface of the third portion of diamond material; wherein each of the first and second integrated circuit structures comprises an integrated circuit die mounted directly on the respective portion of the upper surface of layer of diamond material; a layer of epoxy formed in the gaps between the integrated circuit dies, the transformer and the spaces between the spaced apart portions of diamond material.

2. The galvanic isolation integrated circuit system of claim 1, wherein the diamond material comprises CVD nano- or poly-diamond thin.

3. The galvanic isolation integrated circuit system of claim 1, wherein the dielectric material comprises silicon dioxide.

4. The galvanic isolation integrated circuit system of claim 1, wherein the transformer comprises a first winding connected to the first integrated circuit structure and a second winding connected to the second integrated circuit structure.

5. The galvanic isolation integrated circuit system of claim 1, wherein each of the first and second integrated circuit structures comprises a flip chip die mounted on an upper surface of the layer of diamond material.

6. The galvanic isolation integrated circuit system of claim 1, wherein the first integrated circuit structure has a first operating voltage associated therewith and the second integrated circuit structure has a second operating voltage associated therewith, the first operating voltage being different than the second operating voltage.

* * * * *